United States Patent
Fukushima

[11] Patent Number: 6,141,223
[45] Date of Patent: Oct. 31, 2000

[54] BATTERY ASSEMBLY FOR SUPPLYING POWER TO AN INTEGRATED CIRCUIT

[75] Inventor: Tomio Fukushima, Irvine, Calif.

[73] Assignee: SMK Manufacturing, Inc., Chula Vista, Calif.

[21] Appl. No.: 09/074,603

[22] Filed: May 8, 1998

[51] Int. Cl.[7] .............................. H05K 1/18; H01M 2/10
[52] U.S. Cl. ......................... 361/781; 361/760; 361/782; 361/783; 361/809; 365/52; 365/228; 429/97; 307/116; 439/500; 200/17 R
[58] Field of Search .................................... 361/760, 782, 361/783, 781, 809, 811, 820; 429/96, 97, 99, 100; 365/51, 52, 228, 229; 307/116, 119, 64–66, 150; 439/500; 200/17 R, 52 R; 257/924; 438/19

[56] References Cited

U.S. PATENT DOCUMENTS

| 5,079,741 | 1/1992 | Kimura ..................................... 365/229 |
| 5,331,212 | 7/1994 | Johnson-Williams et al. ............ 307/66 |
| 5,347,163 | 9/1994 | Yoshimura ................................. 307/66 |
| 5,578,391 | 11/1996 | Meyers et al. ............................. 429/97 |
| 5,733,673 | 3/1998 | Kunert ....................................... 429/97 |
| 5,787,054 | 7/1998 | Yasukawa et al. ...................... 368/204 |

*Primary Examiner*—Jeffrey Gaffin
*Assistant Examiner*—John B. Vigushin

*Attorney, Agent, or Firm*—Armstrong, Westerman, Hattorri, McLeland & Naughton

[57] ABSTRACT

A battery assembly is provided for holding a battery and for supplying power to an integrated circuit. When the battery is removed from the battery assembly, the battery assembly provides a LOW level signal to either the high voltage input (Vdd) of the integrated circuit or the reset port of the integrated circuit. The battery assembly includes a battery holder, a negative electrode attached to the battery holder and electrically connected to the a negative power line related to the integrated circuit, and a positive electrode also attached to the battery holder and connected to a positive power line to provide power to the integrated circuit. The positive and negative electrodes are disposed such that the battery may be held between the positive and negative electrodes, with positive and negative terminals of the battery in electrical contact with the positive and negative electrodes. The negative electrode includes an electrically conductive extension. Furthermore, the battery assembly includes a shifting element for shifting the extension into a contact position to be in electrical contact with a reset port of the integrated circuit, or to be in electrical contact with the positive electrode, when the battery is removed from the holder. Thus, a LOW level signal from the negative electrode is provided to a reset port of the integrated circuit or the positive voltage (Vdd) port of the integrated circuit. Thus the integrated circuit is properly reset.

18 Claims, 6 Drawing Sheets

Prior Art

BATTERY ASSEMBLY FOR SUPPLYING POWER TO AN INTEGRATED CIRCUIT

BACKGROUND OF THE INVENTION

1. Field of the Invention

The present invention generally relates to a battery assembly for providing power to an integrated circuit or a semiconductor chip, often used in a remote control device for a television, VCR, audio system and the like. More specifically, the instant invention relates to a battery assembly which enables an integrated circuit to be properly powered down upon removal of the battery.

2. Description of Related Art

In a battery powered device, such as a remote control unit used for a television, VCR, audio system or the like, a problem known as IC latch-up occurs when the operating voltage of the remote control unit falls below the minimum operating voltage of the IC (Integrated Circuit).

In the past, the problem of IC latch-up has been solved with the utilization of a low voltage detector circuit. FIG. 1 illustrates an example of how a low voltage detector circuit is employed with a battery powered IC. The circuit 40, in FIG. 1, simply illustrates the power section of a complete circuit used with an IC in a remote control unit. In the circuit 40 of FIG. 1, a battery 46 has positive and negative sides. The negative side is connected to ground 48. The positive side of battery 46 is connected to the Vdd port of IC 42 through line 50. IC 42 is also connected to ground at 52. A low voltage detector circuit 44 receives positive voltage from line 54 and is grounded at 56. Line 58 goes from low voltage detector circuit 44 to the RESET port of IC 42. Furthermore, a resistor 60 is connected between lines 50 and 58, while capacitor 62 is connected between line 58 and ground 64. In circuit 40, illustrated in FIG. 1, the operation of IC 42 is stopped by providing an output from the low voltage detector circuit 44. When low voltage detector circuit 44 detects a reduction of voltage, the voltage detector circuit outputs a LOW signal on line 58 just before the minimum operating voltage of the IC 42 is reached. This low level signal on line 58 is input to the RESET port of IC 42. This causes the IC to properly stop operation, that is, to properly power down. If, at this time, the batteries are replaced, and the voltage level is thereafter restored to a level higher than the minimum operating voltage of the IC, it will return to its normal operation.

FIG. 1 illustrates the circuit of a microcomputer or integrated circuit used in a remote control device. Specifically, if the power supply voltage to the microcomputer or integrated circuit falls below the specified level, certain undesired operations may be performed or the contents of a memory register may be lost. When power supply voltage returns to normal (when batteries are replaced) it may be necessary to initialize the microcomputer or integrated circuit before normal operations can be performed. Thus, the low voltage detector circuit is employed to protect a microcomputer, or integrated circuit, from this type of problem.

If a low voltage detector circuit is not used in the circuit 40, there is an advantage to use the IC to its absolute operating limit in order to prolong the life of the batteries. However, in this case, even after the IC stops operating, the RESET port will not have gone low yet. In this condition, even if the batteries are replaced, since the IC has not been reset, the IC will not operate properly, as a result. This is the IC latch-up condition. In order to prevent this type of latch-up condition, it is necessary to reset the IC before the new batteries are installed. In order to accomplish this, enough time must be allowed for the circuit to discharge itself until the RESET port goes low, or to incorporate some methods to discharge the circuit automatically. The employment of a low voltage detector circuit, as described above, provides for additional expense, in parts, as well as labor, in manufacturing a remote control unit as described above. This and other disadvantages described above are overcome through the use of the present invention, which provides a low cost alternative to the use of a low voltage detector circuit in a remote control unit.

SUMMARY OF THE INVENTION

The present invention is provided to avoid the problems described above. A lower cost alternative battery assembly is provided for use with battery powered devices in order to prevent IC latch-up, without the attendant higher costs of the use of a low voltage detector circuit.

Specifically, the present invention enables the power circuit used in a battery powered device to be discharged automatically when a battery is removed, thus bringing the Vdd port to a LOW value, thereby preventing IC latch-up. Accordingly to the instant invention, a battery assembly is provided for holding a battery and supplying power to an integrated circuit. The battery assembly includes a battery holder, a negative electrode attached to the battery holder, and electrically connected to a negative power line related to the integrated circuit, and a positive electrode also attached to the battery holder and electrically connected to a positive power line related to the integrated circuit. The battery may be held between the negative and positive electrodes such that the positive and negative terminals of the battery are in electrical contact with the positive and negative electrodes, respectively. One of the positive and negative electrodes includes an electrically conductive extension. Furthermore, the battery assembly also includes a shifting means for shifting the extension into electrical contact with the other one of the positive and negative electrodes, when the battery is removed from the holder.

The shifting means may be a spring or other biasing element for shifting the extension toward and into electrical contact with the other one of the positive and negative electrodes.

It may be the case that the battery holder is mounted on a printed circuit board. In this case, the extension may extend through an opening in the circuit board, such that a contact portion of the extension is generally parallel to the circuit board and located on the opposite side of the circuit board from the battery holder. When the battery is removed from the holder, the spring biases the extension toward the other one of the positive and negative electrodes. The extension makes contact with the other one of the positive and negative electrodes either directly or by way of a trace connected to that electrode. This connection provides a direct short from the Vdd port of the integrated circuit to ground, thus causing the IC to stop operation before IC latch-up occurs. It is then ready for power up when new batteries are installed.

In another variation, the extension from one of the positive and negative electrodes extends directly toward the circuit board itself. In this case, a trace from the other of the positive and negative electrodes is provided on top of the circuit board, the same side as the battery holder. When the battery is removed from the battery holder, the spring biases the extension toward the other of the positive and negative electrodes, such that the extension electrically contacts the trace of the other of the positive and negative electrodes. This, again provides a desired effect, in which the circuit is automatically discharged to bring the Vdd port of the integrated circuit to a lower level.

In a further variation, with a similar structure as described above, when the battery is removed, a connection is made so that the ground or LOW level is directly applied to the reset port rather than the Vdd port. This applies a LOW level to the reset port and thus properly resets the IC in order to prevent IC latch-up from occurring. Thus, the IC will also be ready for power up when new batteries are installed.

While the above description has been provided with regard to a remote control unit, commonly in use with consumer electronics today, this invention may be applied to any product which currently uses batteries.

DETAILED DESCRIPTION OF THE INVENTION

Figure 1:
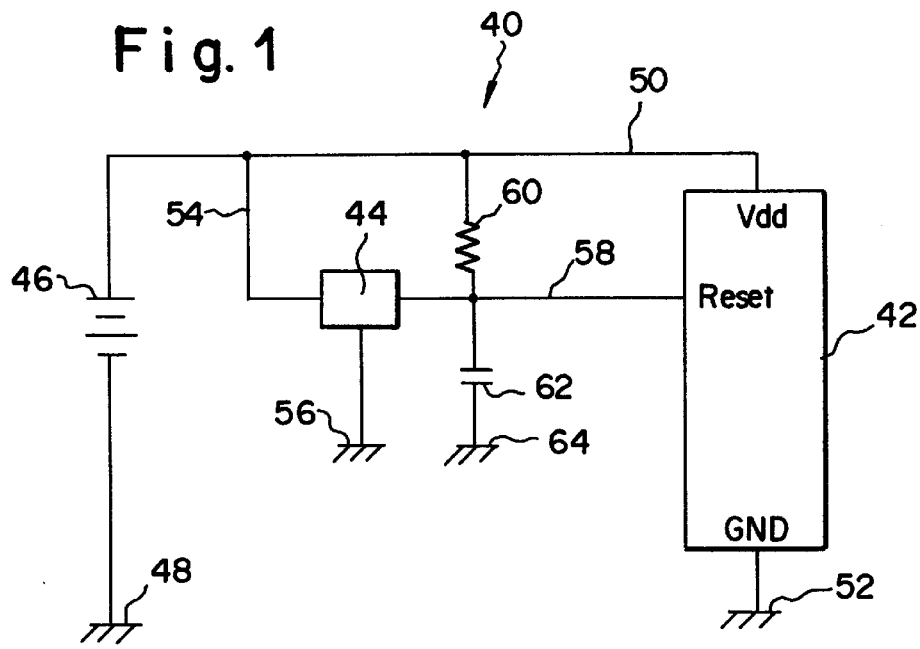
FIG. 1 is a schematic diagram illustrating a conventional circuit for providing battery power to an integrated circuit.

The instant invention will be described with regard to the drawings as set forth above. More specifically, the present invention will be described with reference to FIGS. 2a–5. In these figures, like elements will be labeled with the same reference numerals.

Figure 2A:
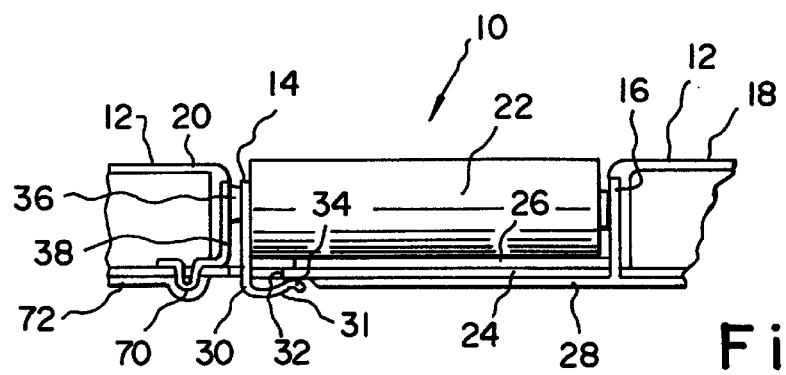
FIG. 2a is an illustration of the battery assembly according to the present invention, with a battery installed therein.
Figure 2B:
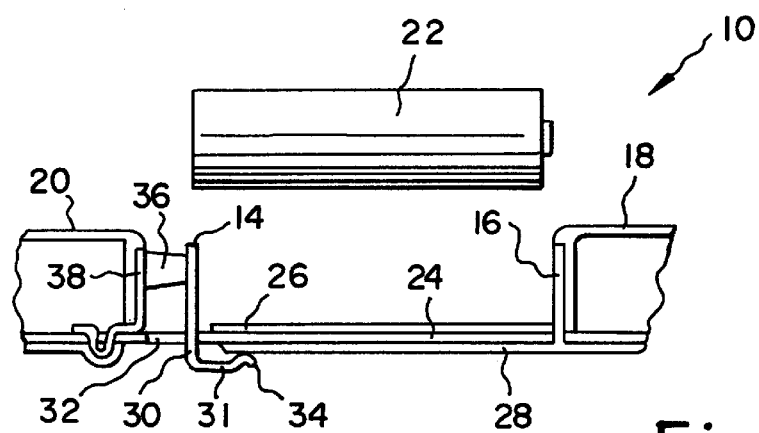
FIG. 2b illustrates the battery assembly of FIG. 2a, with the battery removed.

The battery assembly, according to the present invention, is illustrated in FIGS. 2a and 2b. Specifically, battery assembly 10 includes battery holder 12, negative electrode 14 and positive electrode 16. Battery holder 12 includes a positive side support 18 and a negative side support 20. FIG. 2a illustrates battery 22 in its installed position. The positive side support 18 and negative side support 20 of battery holder 12 are mounted on printed circuit board 24. A cushioning and insulating pad 26 is provided between printed circuit 24 and battery 22. Positive electrode 16 is connected through the circuit board to a positive trace 28 which extends along a portion of the underside of the circuit board 24.

Negative electrode 14 includes L-shaped extension 30 extending downwardly from the electrode through opening 32 in circuit board 24. Extension 30 has a contact portion 31 which extends generally parallel to circuit board 24 and is disposed on the opposite side of the circuit board from battery holder 12. Contact portion 31 may or may not have a tip 34. When the battery 22 is installed, tip 34 of contact portion 31 rests against the underside of printed circuit board 24. Positive trace 28 extends along the underside of circuit board 24, but terminates before making contact with contact portion 31. Negative electrode 14 is connected to lead 38 by way of compressed spring 36. Lead 38 includes a nipple 70 which extends through the circuit board 24 and connects to negative trace 72. Negative trace 72 connects to a negative power line or ground on circuit board 24, while positive trace 28 extends to the positive power line which provides power to the integrated circuit.

FIG. 2b illustrates the battery assembly 10 with the battery 22 removed. With battery 22 removed, spring 36 biases negative electrode 14, and accordingly extension 30 toward positive electrode 16. As extension 30 is shifted toward positive electrode 16, it moves to the maximum distance allowed by opening 32. At that point, tip 34 of contact portion 31 of extension 30 is in contact with positive trace 28.

Figure 4:
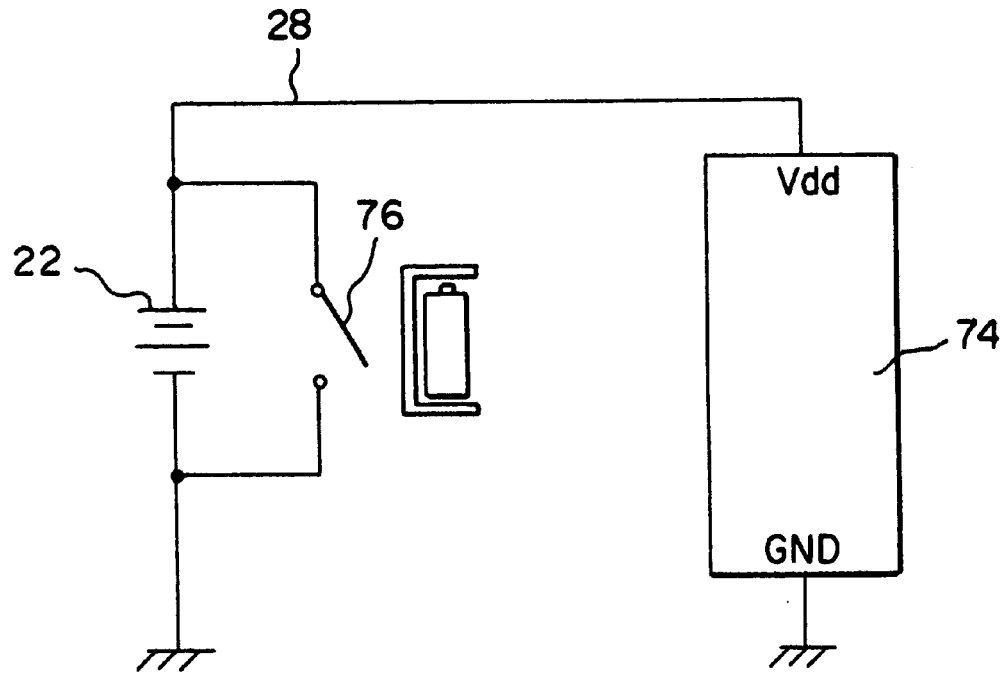
FIG. 4 is a schematic diagram illustrating the electrical structure of the instant invention with the battery installed.
Figure 5:
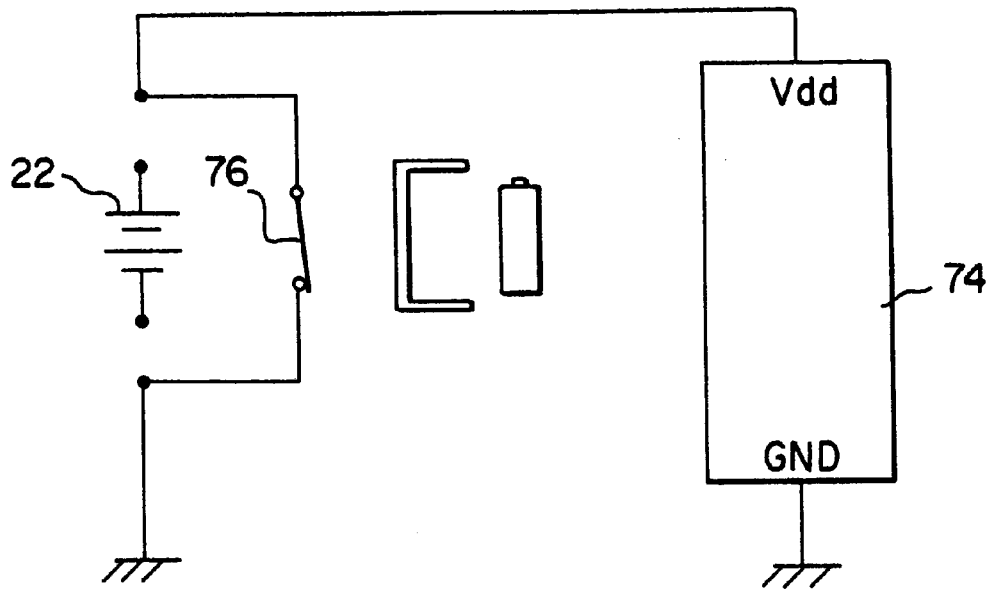
FIG. 5 is a schematic diagram illustrating the electrical structure of the instant invention with the battery removed.

FIGS. 4 and 5 are schematics illustrating the two states described in FIGS. 2a and 2b. Specifically, FIG. 4 illustrates the state of 2b in which the battery is installed. FIG. 5 illustrates the state of FIG. 2b in which the battery is removed.

Specifically, in FIG. 4, battery 22 provides power to IC 74 by way of positive trace 28. Power is provided to IC 74 at the Vdd port. The negative side of battery 22 is grounded, as is the ground port of integrated circuit 74. Switch 76 of FIG. 4 illustrates the situation in which contact portion 31 of extension 30 does not contact trace 28, when battery 22 is installed. Thus, there is no short circuit between the positive and negative terminals of the battery. Thus, in FIG. 4, when the battery is installed, power is provided directly from the positive terminal of battery 22, through trace 28 to the Vdd port of integrated circuit 74.

Figure 3A:
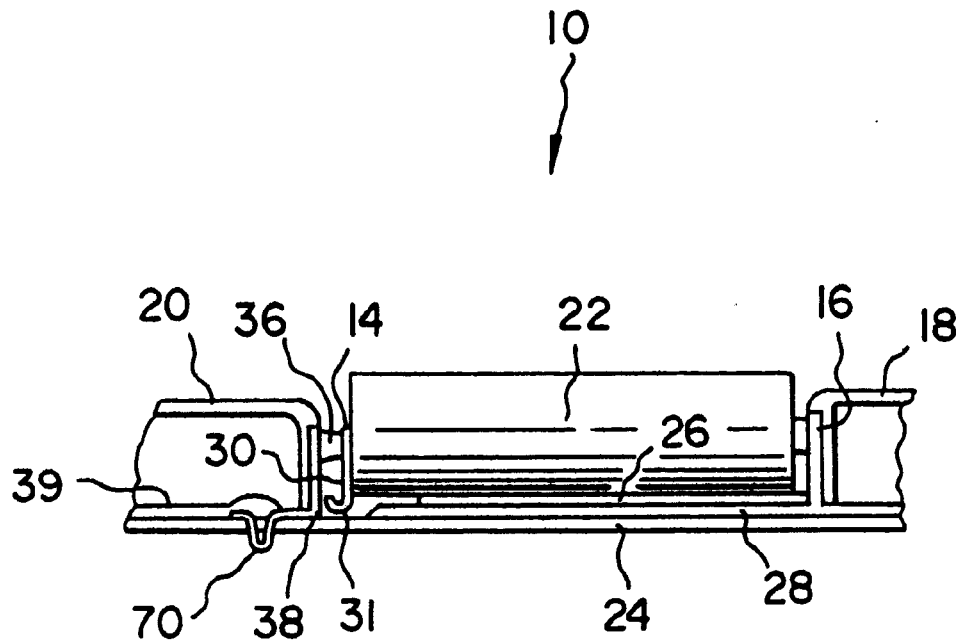
FIG. 3a illustrates a variation of the battery assembly according to the present invention, with the battery installed.
Figure 3B:
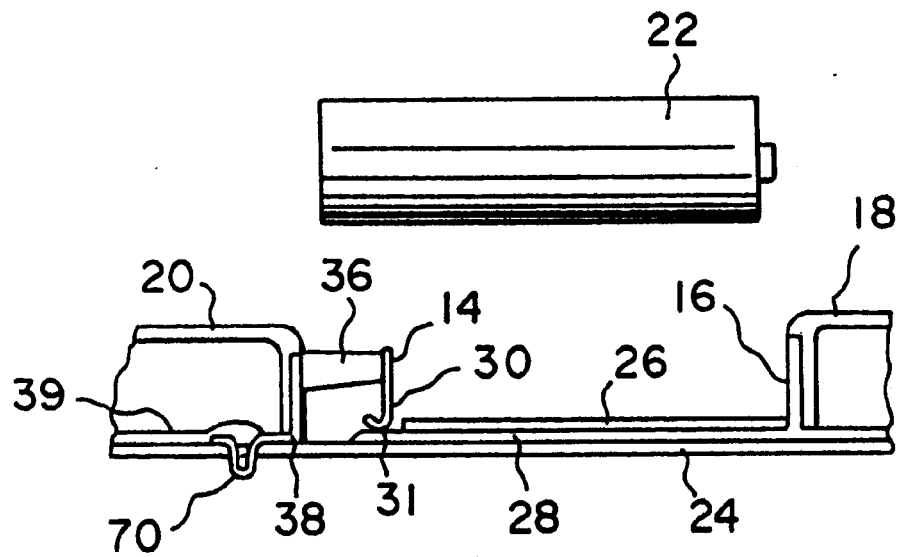
FIG. 3b illustrates the battery assembly of FIG. 3a, with the battery removed.

FIG. 5 illustrates the condition of FIG. 2b, in which the battery is removed from the battery holder. Switch 76, which is closed, represents the connection between contact portion 31 of extension 30 and positive trace 28 (as illustrated in FIG. 2b), when the battery is removed. Thus, in FIG. 5 when switch 76 is closed, a ground or LOW level is provided directly to the Vdd port of integrated circuit 74, thus stopping the operation of integrated circuit 74, and preventing IC latch-up FIGS. 3a and 3b illustrate a variation of the present invention, in which FIG. 3a illustrates the invention with the battery installed and FIG. 3b illustrates the invention with the battery removed. Elements in FIGS. 3a and 3b which correspond with elements in FIGS. 2a and 2b will be numbered with the same reference numerals.

In FIG. 3a, battery 22 is held between negative electrode 14 and positive electrode 16. Positive side support 18 and negative side support 20 provide support for positive electrode 16 and negative electrode 14, respectively. Printed circuit board 24 is provided as a substrate supporting the battery holder 10. On top of circuit board 24 is positive trace 28 which electrically connected with positive electrode 16 and insulating pad 26 insulates and provides a cushion for battery 22. Negative electrode 14 has an extension 30 extending downwardly therefrom toward the circuit board 24 with a contact portion 31 at the end thereof. Negative electrode 14 is connected to lead 38 with a nipple 70 extending through circuit board 24. Lead 38 and nipple 70 are connected to a negative power line 39 which leads to a ground line on the circuit board. In FIG. 3a, there is no electrical contact between contact portion 31 of extension 30 and positive trace 28. In FIG. 3b, when battery 22 is removed, compressed spring 36 decompresses, thus causing negative electrode 14, along with extension 30 and contact portion 31 to move toward positive electrode 16. As seen in FIG. 3b, the extension 30 contacts positive trace 28 through contact portion 31. Thus, with battery 22 removed, negative electrode 14 and positive electrode 16 are in electrical contact with one another. As illustrated in FIG. 5, this causes the LOW level (or ground potential) of negative electrode 14 to be applied to the Vdd port of the integrated circuit. Accordingly, the operation of the integrated circuit is stopped.

Figure 6A:
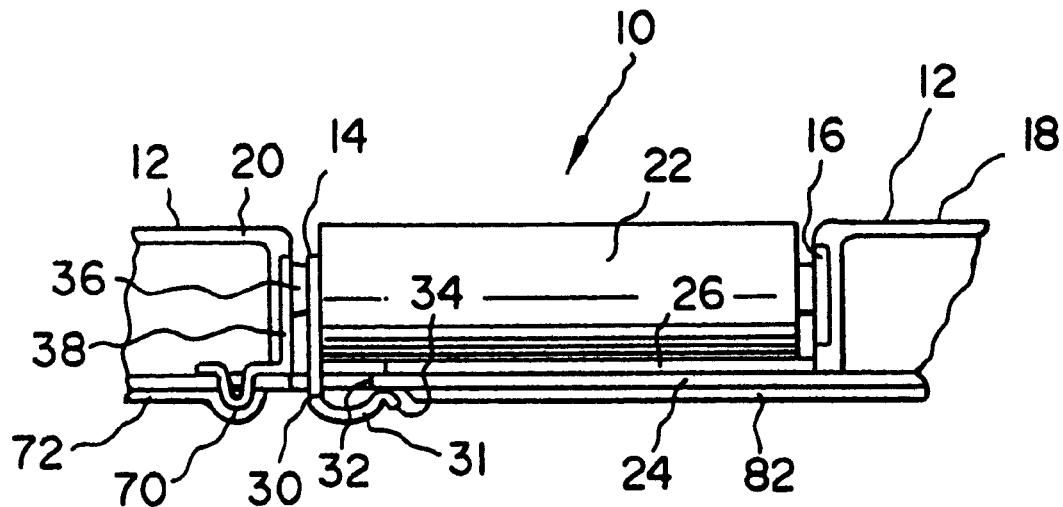
FIG. 6a illustrates a variation of the battery assembly according to the instant invention, with a battery installed therein.
Figure 6B:
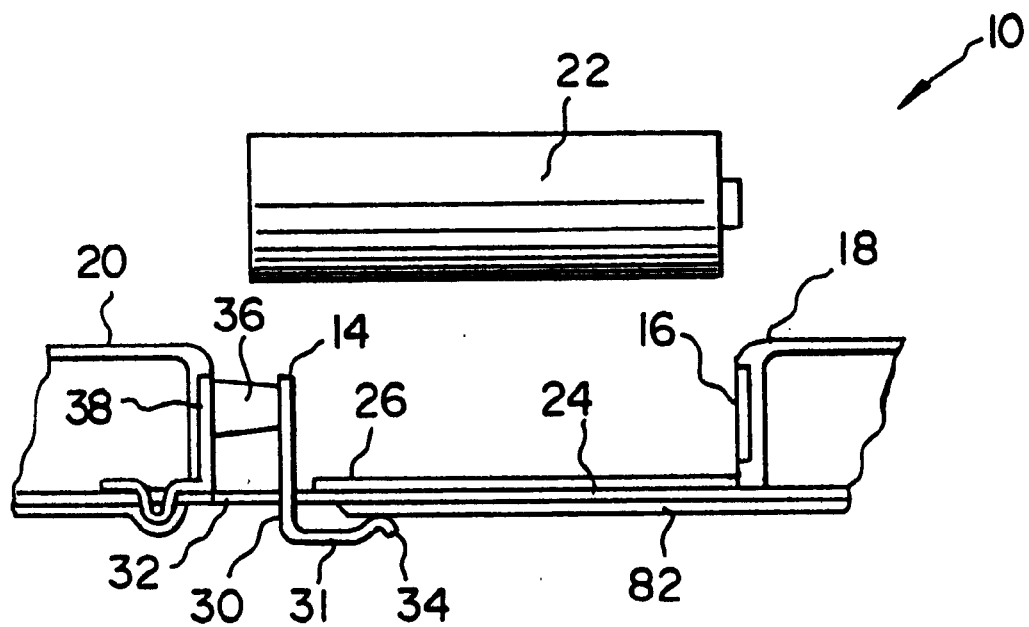
FIG. 6b illustrates the battery assembly of FIG. 6a, with the battery removed.
Figure 8:
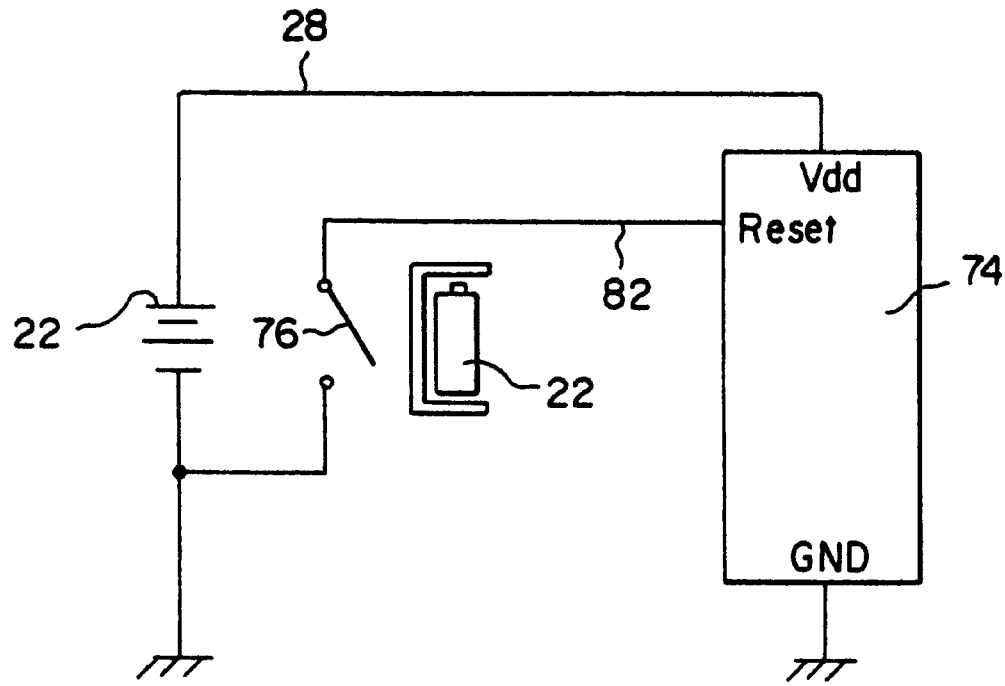
FIG. 8 is a schematic diagram illustrating the electrical structure of the variation illustrated in FIGS. 6a and 7a, with the battery installed.

FIGS. 6a and 6b are variations of the invention illustrated in FIGS. 2a and 2b. Like elements in FIGS. 6a and 6b (with respect with FIGS. 2a and 2b) will be indicated by the same reference numerals. In FIG. 6a, in which the battery is in place, contact portion 31 of extension 30 makes no contact. Thus, negative electrode 14 simply contacts the negative terminal of battery 22. The schematic of FIG. 8 illustrates this condition.

Figure 9:
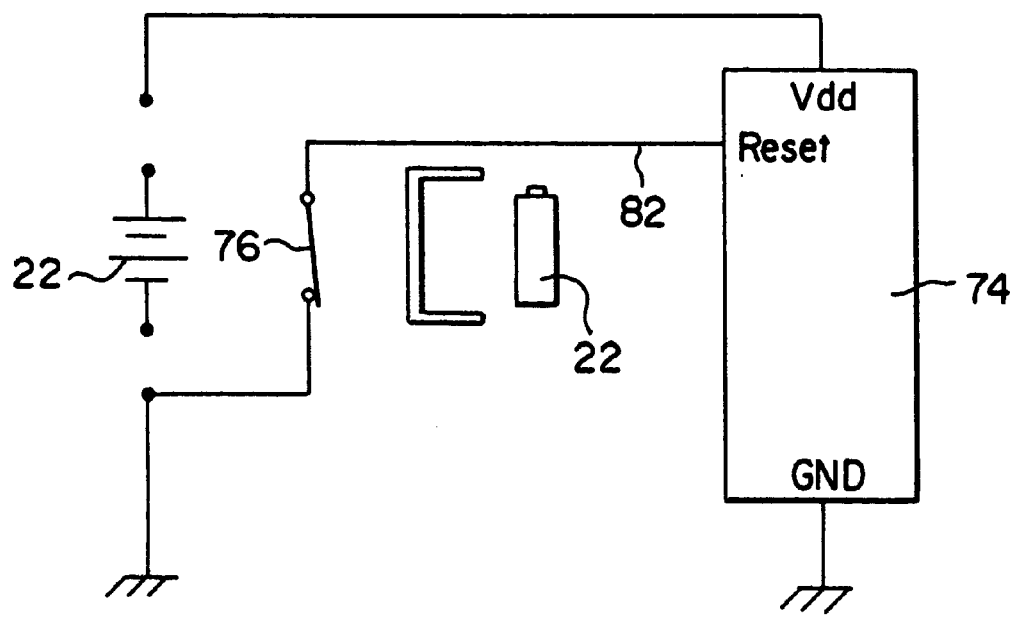
FIG. 9 is a schematic diagram illustrating the electrical structure of the variation illustrated in FIGS. 6b and 7b, with the battery removed.

When the battery is removed, in FIG. 6b, the biasing action of compression spring 36 causes negative electrode 14 to move to the right, as seen in FIG. 6b. When negative electrode 14 moves to the right, tip 34 of contact portion 31 of extension 30 comes into contact with reset trace 82 which is connected to the reset port of IC 74. FIG. 9 illustrates the condition in which battery 22 is removed. In FIG. 9, reset trace 82 is connected to ground. Accordingly, a LOW level is therefore applied to the reset port of IC 74, thereby causing IC 74 to properly reset, and avoiding the problem of IC lock up. Otherwise, the device illustrated in FIGS. 6a and 6b works substantially the same as that in FIGS. 2a and 2b.

Figure 7A:
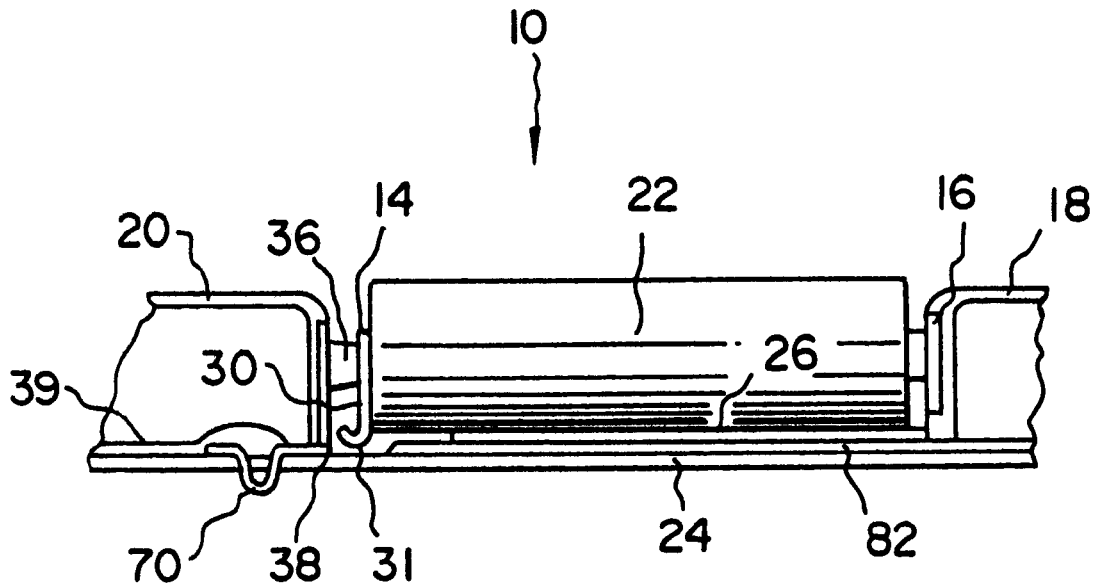
FIG. 7a is an illustration of another variation of the battery assembly according to the present invention, with a battery installed therein.
Figure 7B:
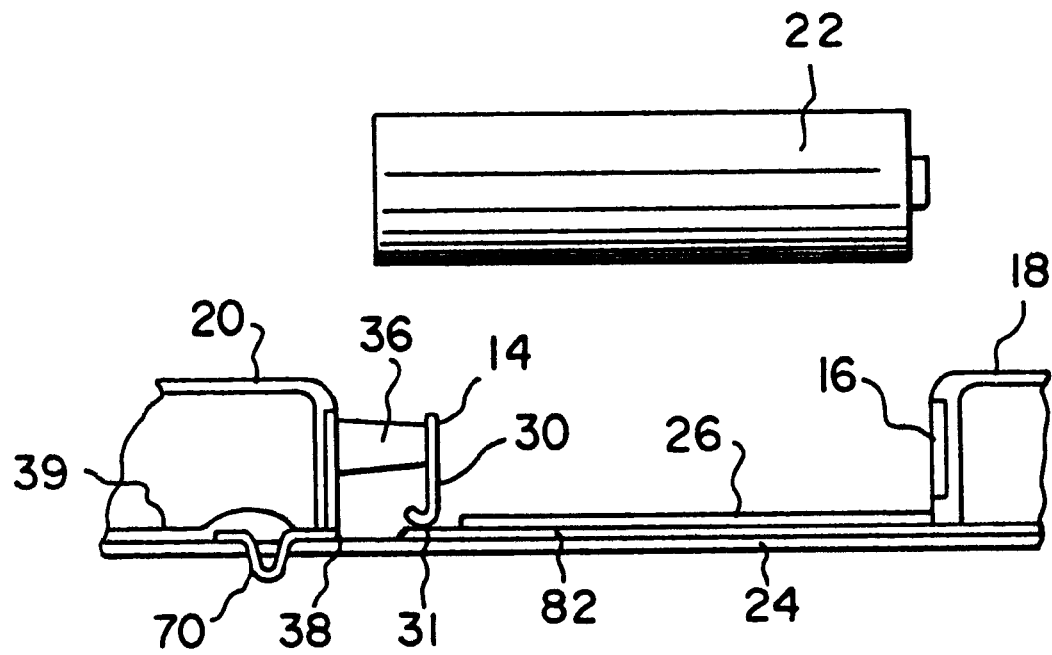
FIG. 7b illustrates the battery assembly of FIG. 7a, with the battery removed.

FIGS. 7a and 7b is similar to the device illustrated in FIGS. 3a and 3b. However, in FIG. 7b, the negative electrode makes contact with the reset port of the IC. As in FIGS. 3a and 3b, the contact portion 31 of extension 30 does not extend through the circuit board 24. FIG. 7a represents the condition in which the battery is in place, as also illustrated by the schematic of FIG. 8. In FIG. 7a, contact portion 31 of extension 30 is not in electrical contact with any element. Thus, the negative electrode 14 is simply in contact with the negative terminal of battery 22. FIG. 7b illustrates the condition in which the battery 22 is removed. This is also illustrated by the schematic of FIG. 9. FIG. 7b illustrates that compression spring 36, when the battery 22 is removed, biases contact portion 31 of extension 30 rightwardly so that contact portion 31 of extension 30 contacts reset trace 82. Reset trace 82 is connected to the reset port of IC 74, as illustrated in FIG. 9. Thus, when the battery 22 is removed, reset trace 82 is connected to ground potential and thus a LOW level is supplied to the reset port of IC 74. Accordingly, the IC 74 may be properly reset, thus preventing IC latch-up.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

I claim:

1. A battery assembly for holding a battery and supplying power to an integrated circuit, said battery assembly comprising:

a battery holder;

a negative electrode attached to said battery holder, and electrically connected to a negative power line related to the integrated circuit;

a positive electrode, also attached to said battery holder and electrically connected to a positive power fine to provide power to the integrated circuit, such that the battery may be held between said positive and negative electrodes, with the positive and negative terminals of the battery in electrical contact with said positive and negative electrodes, respectively, wherein one of said positive and negative electrodes includes an electrically conductive extension; and a shifting means for shifting said extension into electrical contact with the other one of said positive and negative electrodes, when the battery is removed from said holder.

2. The battery assembly of claim 1, wherein said negative electrode includes said extension.

3. The battery assembly of claim 1, wherein said shifting means includes a spring for biasing said extension into electrical contact with the other one of said positive and negative electrodes.

4. The battery assembly of claim 3, wherein said battery holder is mounted on a printed circuit board.

5. The battery assembly of claim 4, wherein said extension extends through an opening in said circuit board.

6. The battery assembly of claim 5, wherein said extension generally has an L-shape with a contact portion thereof extending generally parallel to said circuit board, and on an opposite side of said circuit board from said battery holder.

7. The battery assembly of claim 6, wherein said contact portion of said extension contacts a trace, formed on the opposite side of said circuit board from said battery holder and electrically connected to the other one of said positive and negative electrodes, when said battery is removed from the holder.

8. The battery assembly of claim 4, wherein said extension extends toward said circuit board.

9. The battery assembly of claim 8, wherein a contact portion of said extension is biased, by said spring toward a trace on top of said circuit board, said trace being electrically connected to the other of said positive and negative electrodes, such that said contact portion of said extension electrically contacts said trace when the battery is removed.

10. A battery assembly for holding a battery and supplying power to an integrated circuit, said battery assembly comprising:

a battery holder;

a negative electrode attached to said battery holder, and electrically connected to a negative power line related to the integrated circuit;

a positive electrode, also attached to said battery holder and electrically connected to a positive power line to provide power to the integrated circuit, such that the battery may be held between said positive and negative electrodes, with the positive and negative terminals of the battery in electrical contact with said positive and negative electrodes, respectively, wherein said negative electrode includes an electrically conductive extension; and a shifting means for shifting said extension into a contact position in electrical contact with a reset port of the integrated circuit, when the battery is removed from said holder.

11. The battery assembly of claim 10, further comprising a reset trace electrically connected to the reset port of the integrated circuit, wherein when said extension is in said contact position, it is contacting said reset trace.

12. The battery assembly of claim 11, wherein said shifting means includes a spring for biasing said extension into electrical contact with said reset trace.

13. The battery assembly of claim 12, wherein said battery holder is mounted on a printed circuit board.

14. The battery assembly of claim 13, wherein said extension extends through an opening in said circuit board.

15. The battery assembly of claim 14, wherein said extension generally has an L-shape with a contact portion thereof extending generally parallel to said circuit board, and on an opposite side of said circuit board from said battery holder.

16. The battery assembly of claim 15, wherein said contact portion of said extension contacts said reset trace when said battery is removed from the holder, said reset trace being formed on the opposite side of said circuit board from said battery holder.

17. The battery assembly of claim 13, wherein said extension extends toward said circuit board.

18. The battery assembly of claim 17, wherein a contact portion of said extension is biased, by said spring toward said reset trace, said reset trace being formed on top of said circuit board, such that said contact portion of said extension electrically contacts said reset trace when the battery is removed.

* * * * *